United States Patent [19]
Pascucci et al.

[11] Patent Number: 5,844,851
[45] Date of Patent: *Dec. 1, 1998

[54] ANTI-NOISE AND AUTO-STAND-BY MEMORY ARCHITECTURE

[75] Inventors: Luigi Pascucci, Giovanni; Marco Olivo, Bergamo, both of Italy

[73] Assignee: SGS-Thomson Microelectronics, S.r.l., Agrate Brianza, Italy

[*] Notice: The term of this patent shall not extend beyond the expiration date of Pat. No. 5,404,334.

[21] Appl. No.: 412,553

[22] Filed: Mar. 29, 1995

Related U.S. Application Data

[62] Division of Ser. No. 901,862, Jun. 22, 1992, Pat. No. 5,404,334.

[30] Foreign Application Priority Data

Jul. 31, 1991 [IT] Italy .............................. VA/91/A/0022

[51] Int. Cl.⁶ .................................................. G11C 13/00
[52] U.S. Cl. .................... 365/210; 365/189.05; 365/194; 365/206; 365/233.5
[58] Field of Search ................................. 365/233.5, 206, 365/210, 227, 19, 189.05, 230.06

[56] References Cited

U.S. PATENT DOCUMENTS

| | | | |
|---|---|---|---|
| 4,800,304 | 1/1989 | Takeuchi | 307/602 |
| 4,953,130 | 8/1990 | Houston | 365/203 |
| 4,982,366 | 1/1991 | Takemae | 365/195 |
| 5,029,135 | 7/1991 | Okubo | 365/203 |
| 5,031,153 | 7/1991 | Suyama | 365/206 |
| 5,404,334 | 4/1995 | Pascucci et al. | 365/233.5 X |

FOREIGN PATENT DOCUMENTS

| | | |
|---|---|---|
| 0 023 329 | 2/1981 | European Pat. Off. . |
| 0 090 590 | 10/1983 | European Pat. Off. . |
| 0 233 550 | 8/1987 | European Pat. Off. . |

*Primary Examiner*—Do Hyun Yoo
*Attorney, Agent, or Firm*—David V. Carlson; Kevin S. Ross; Seed and Berry LLP

[57] ABSTRACT

Spurious memory readings which may be caused by noise induced by transitions in the output buffers of a fast parallel memory device are prevented by permitting output latches to change state in function of newly extracted data signals by means of an enabling pulse having a preestablished duration and which is generated only after a change of memory address signals has occurred and the new configuration of memory address signals has lasted for a time which is not shorter than the time of propagation of signals through the memory chain. The enabling pulse is generated by employing a detector of transitions occurring in the input circuitry of the memory, a dummy memory chain, a one-shot pulse generator and a resetting pulse generator. The anti-noise network may be exploited also for implementing an auto-stand-by condition at the end of each read cycle, which reduces power consumption and increases speed by simplifying the sensing process.

10 Claims, 3 Drawing Sheets

5,844,851

ANTI-NOISE AND AUTO-STAND-BY MEMORY ARCHITECTURE

CROSS-REFERENCE TO RELATED APPLICATION

This application is a division of U.S. patent application Ser. No. 07/901,862, filed Jun. 22, 1992 now U.S. Pat. No. 5,404,334.

TECHNICAL FIELD

The present invention relates to memory devices and in particular to fast parallel memory devices.

BACKGROUND OF THE INVENTION

A recurrent problem which is also particularly difficult to resolve of fast parallel memory circuits is the noise induced by the switchings of the output buffers. The problem is as more severe as higher is the degree of parallelism of the memory array and as greater is the specific speed of the memory. The numerousness and fastness of transitions determine large sudden power absorptions which generate oscillatory phenomena through supply lines and these, in turn, may trigger "rebounds" in circuits particularly vulnerable to noise. Generally the circuit portions of a memory most sensitive to noise are those wherein the nodes are driven to intermediate potentials as compared with the logic levels VDD-GND, such as sense amplifiers, voltage reference systems, and TTL-compatible input circuits. According to a known architecture, the various circuital structures which form the memory interact continuously among each other, thus propagating down to an output any change which may have occurred at any point of a signal propagation chain. The consequence is that the access and data extraction time is prolonged in practice beyond the design limits and the output switchings are affected by rebounds relative to false readings.

A disturbance is more likely to manifest itself as more close to an output is the circuitry vulnerable to noise; i.e., to a shorter path "source of disturbance—output buffer" corresponds a more immediate reaction to noise and a higher probability of the occurrence of resonance phenomena between two circuit portions.

For these reasons, sense amplifiers and the respective reference systems are the circuit portions most responsible for noise-induced instability because they are practically connected directly to the output buffers.

Heretofore, different approaches have been followed for reducing the magnitude of primary disturbances caused by transitions occurring in output buffers:

(a) reduction of the size of buffers;
 (b) elimination of crowbar currents in the final push-pull stages of the buffers;
 (c) performing constant-current transitions in the output stages; and
 (d) delaying output buffer transitions.

However, all these known approaches do not entirely solve the problem and/or introduce an additional delay.

SUMMARY OF THE INVENTION

It has now been found that the above-noted technical problem may be effectively solved by constructing a memory with a peculiar architecture capable of providing for the memory effective antinoise "filtering" properties. The inventive approach is to make the system transparent to a disturbance while intervening upon its propagation thereof.

Immunity to noise caused by the output switchings is attained by the device object of the present invention, ensuring a preselected sequence to a chronological sequence of events which accomplishes a complete reading cycle.

Basically, in accordance with the present invention, a changing of state of an output is not allowed unless the stimulus to such a change of state can be recognized as having been originated by a transition in the input circuitry and as having actually completed the entire signal propagation path to the output circuitry.

Any other signal capable of causing output data modification but deriving from a process, which only partially satisfies the above-noted conditions, and which may reach the input of an output buffer of the memory, is positively made ineffective.

The subordination of the modification of data resident at the memory's output to a necessarily occurred transition event in the input and address circuitry of the memory determines elimination of the effects on the memory's output of all those spurious sources of disturbances which may interfere with the correctness of the information delivered through an output. The derived advantage is due to the fact that the flow of data, including false data which may be spuriously introduced by the noise generated by the output switchings, is "transparent" and the system is capable of automatically correcting itself in case of errors which may be generally imputed to noise.

The anti-noise memory's architecture of the invention has revealed itself useful also for implementing another advantageous capability of the memory to assume automatically a stand-by state (e.g., all wordlines and all bitlines deactivated and no power consumption) after an extracted datum is transferred to an output buffer at the end of a reading cycle and essentially before the starting of a new reading cycle. Contrary to what happens in common memories wherein the substantial simultaneity between deselection of a previously selected wordline and bitline implies, at least for the entire signal propagation transient time, an active condition of both wordlines and bitlines and therefore the univocity condition corresponding to the new address is attained only at the end of the propagation transient, in a memory made according to this preferred embodiment of the invention, the memory is reset in a stand-by condition upon the completion of a read cycle so that any subsequent read cycle may start already in a condition of univocity of selection actually preventing a transitory simultaneous state of activity of two wordline and/or two bitlines, at any moment. A reduced power consumption and a shorter access time may thus be achieved.

DETAILED DESCRIPTION OF THE INVENTION

Figure 1:
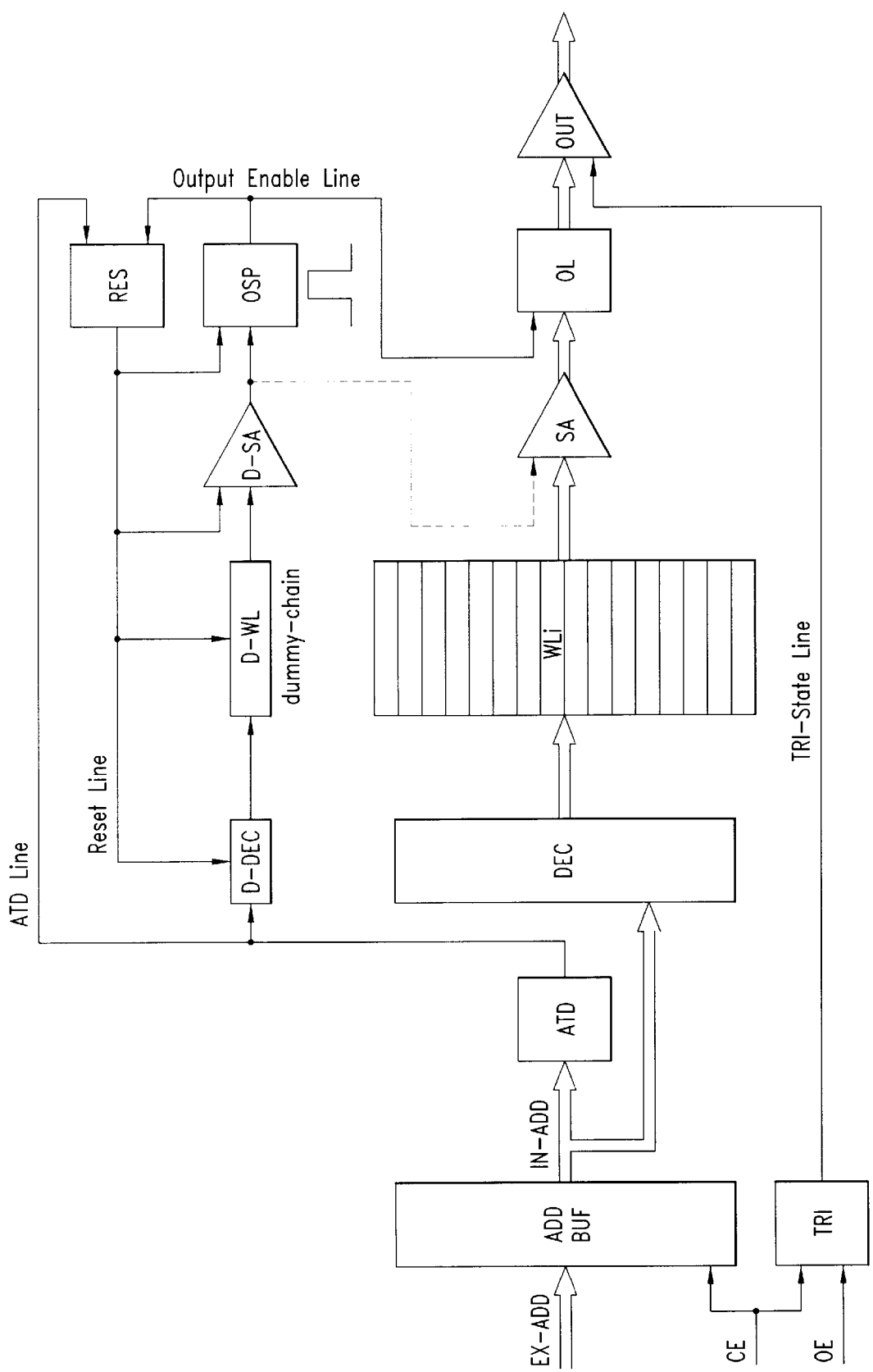
FIG. 1 is a functional block diagram of a memory device made in accordance with the present invention.

With reference to FIG. 1, a memory device is functionally composed, in accordance with a typical architecture, of an input and control circuitry (ADD-BUF and TRI), a decoding and addressing circuitry (DEC), a matrix of memory cells organized in rows and columns (WLi), a sense amplifier circuit (SA), an output latch circuit (OL) and an output buffer (OUT) which customarily is controlled through an enabling line (TRI-state line), by the control circuitry (TRI), according to techniques which are well-known to a skilled technician. (To more easily distinguish the structural features of the circuit of the present invention, the circuit portions which typically compose a prior art memory device are drawn with relatively thin lines, while the additional circuital portions which characterize the architecture of the memory device made in accordance with the present invention are drawn with relatively heavier lines in the attached figures.)

In accordance with the present invention, the memory device is provided additionally with a transition detecting circuit ATD, which is functionally coupled to the input circuitry of the memory and which is capable of generating through an output node, a pulse at every transition of signals within the input circuitry of the memory. The output node of the transition detecting circuit ATD is wired to the input of a dummy chain, which consists of a succession of circuit blocks, each block being designed to replicate the same delaying conditions for the propagation of a signal through said decoding and selection circuitry DEC, said memory matrix WLi and said sense amplifier SA, by employing for the purpose dummy circuits which are substantially homologous to the above-noted circuits. That is, the dummy chain includes a dummy DEC, D-DEC; a dummy memory matrix, D-WL, and a dummy sense amp, D-SA circuit blocks, functionally connected in a cascade arrangement. Each homologous block of the dummy chain may be individually enabled by means of a reset signal. An output of the dummy chain is wired to an input of a one-shot pulse generator, OSP, which is capable of generating an enabling pulse for an output latch circuit OL capable of storing an extracted datum.

The control of the dummy chain is implemented by means of a reset signal RES having two inputs, an input of which is connected to the output of the one-shot pulse generator OSP, while the other input is wired to the input of the dummy chain, i.e., to the output of the transition detecting circuit ATD. The reset signal which is generated by the RES block enables simultaneously the blocks of the dummy line and the one-shot pulse generator OSP.

The purposes and effects of a so-controlled dummy chain are the following:

(1) Each output latch is substantially isolated from the "internal" circuitry of the memory;

(2) Each output latch effectively determines what datum will be present on the respective output;

(3) Each output latch is controlled by an enabling system which essentially can be stimulated exclusively by transitions of signals occurring in the input circuitry of the memory device.

A datum stored in an output latch may be modified only at the end of each complete reading cycle, during an extremely short interval of time which terminates before a transition of the datum present on the output of the device takes place.

The unique succession of events which is capable of modifying a datum contained in an output latch of the memory device may be represented in the following chronological sequence of events:

(a) a transition occurring in the input circuitry;

(b) enabling of the decoding and selection circuits;

(c) propagation of signals through the selection lines;

(d) enabling of the sense amplifiers;

(e) loading of extracted data in the output latches;

(f) transmission of the extracted data through the output buffers.

The progress of signal propagation occurs under the control exerted by the dummy chain and the control circuits which are associated with the latter. This permits transmission of "read" data to the output buffers only if caused by a transition of the input signals.

The dummy chain satisfies the following requisites:

(a) At the end of each reading cycle, the circuit blocks which compose the dummy chain are automatically disabled.

(b) During stand-by intervals of the memory, the dummy chain is constantly kept in a disabled state by means of the reset network.

(c) Every ATD pulse maintains all the blocks of the dummy chain disabled for the entire duration of the pulse.

(d) Only upon elapsing of an ATD pulse, the propagation of the pulse itself through the dummy chain is permitted, which leads to the generation by the OSP circuit of an enabling pulse, to the enabling of the output latch OL.

(e) Any ATD pulse succeeding a first ATD pulse and which is generated during an interval of time after said first pulse which is shorter than the propagation time of a signal along the dummy chain nullifies the triggering effects of the first ATD pulse by resetting the initial rest (disabled) condition in every block of the dummy chain.

(f) As a result, in a rapid succession of ATD pulses, only the last pulse determines the enabling of the output latch OL.

Of course, all the circuits which compose the dummy chain or which are associated therewith for exerting the type of control which has been described above, may be realized in any appropriate form, without any substantial restraint on the type or on the circuit configuration which is actually used for making them.

In a stand-by condition, the dummy chain is forcibly disabled, thus preventing any possible modification of the content of the output data storing structures (OL) and therefore of the relative buffers. Therefore, the output buffers will assume an output configuration in function of the information stored in the respective output latch, if in an enabled condition, or will be in a state of high impedance if disabled by means of the controlling TRI-state line.

As soon as a modification occurs in the configuration of the input circuitry or of the control signal CE, while along the basic circuit chain of the memory the selection signals propagate thus locating the addressed cell of the memory matrix, the transition detector ATD provides to activate the parallel signal path through the dummy chain, which, because of the perfect synchronization which exists, by the triggering of the one-shot pulse generator circuit OSP at the end of the propagation, permits the output latch circuit OL to respond to the sense amplifier's stimulus and therefore to load the newly extracted datum and eventually transmit it to the output buffer at the instant the pulse generated by the OSP circuit decays.

Simultaneously, the reset network disables again the dummy chain, thus preventing a renewed enabling of the output latch OL. An eventual "echo" of the noise produced by an output transition into the memory system is rendered of no consequence on the output configuration, because the outputs are in practice disconnected from the rest of the memory circuits because of a persisting disabled state of the output latch circuits (OL).

The only points where the noise may produce effects are within the input circuitry where an original configuration which had driven a just completed reading cycle could be misinterpreted by the same input circuitry while the noise generated by the switching at the outputs persists.

In such a condition, the input circuitry notwithstanding an actually unchanged configuration, may produce a false ATD pulse because of an erroneous modified interpretation of the levels affected by the noise which could lead to recognition of a spuriously different input configuration leading to a spurious addressing of the memory. The false reading could then conduct to erroneous data if the output buffers are directly connected to the memory circuits. In view of the fact that the noise induced by output transitions does not last indefinitely and, in the great majority of cases, has a relatively short duration, which is shorter than the propagation time of signals through the internal paths of the memory device, before an eventual false enabling pulse reaches the output latch OL through the dummy chain, a virtual new reading cycle begins upon the decaying of the noise and therefore because of the consequent reestablishment of a correct "configuration" in the input circuitry.

The consequent new ATD pulse which is generated nullifies in practice the effects produced by any false transition induced by the noise in the input circuitry, thus practically initiating a repeated reading cycle with correctly interpreted addresses. This leads to extraction of the same datum which was extracted at the beginning; therefore, no further output transition is caused, and therefore no further generation of noise occurs.

If in the meantime a new configuration is presented to the input circuitry of the memory, the new ATD pulse which ensues immediately interrupts the propagation in progress by starting a new reading cycle in the same way as described herein before, without any penalty in terms of speed.

The transfer of the ATD pulses through the dummy chain, when the latter is enabled, makes available at the output of the homologous dummy sense amplifier D-SA of the dummy chain, a signal which may be used as a control signal of the sense amplifier SA of the memory. This possibility is shown in the block diagram of FIG. 1 by an optional wiring drawn with a dash line. Normally differential type sense amplifiers avail themselves of input networks which comprise control circuits and switches which are normally controlled by means of one or more timing signals. One of these timing signals may conveniently be represented by an ATD pulse propagated through the dummy chain of the anti-noise memory's architecture of the invention, as it will be evident to a skilled technician.

As shown, the ATD pulse is also fed to the decoding and selection circuit as a start signal for initiating a reading cycle of the memory.

Figure 2:
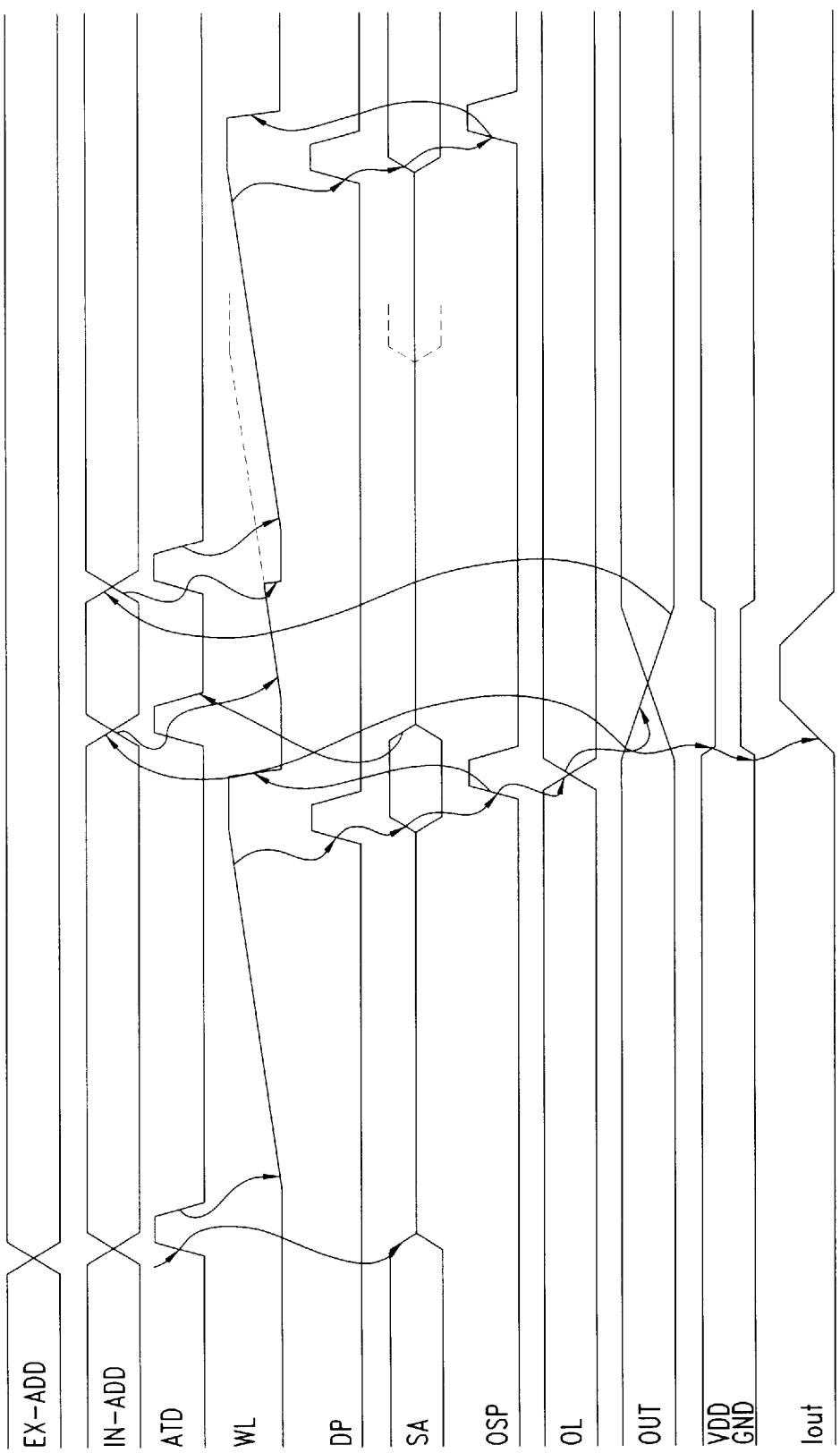
FIG. 2 shows a plurality of time-based diagrams of the representative signals of the circuit of FIG. 1.

The diagrams of the representative signals of the circuit of the invention are depicted in FIG. 2.

It should be noted that because of the immunity to noise which is attained with the peculiar architecture of the invention, it is possible to increase without adverse effects the size of the output push-pull stages of the buffers for improving the performance of the memory device in terms of access time.

Figure 3:
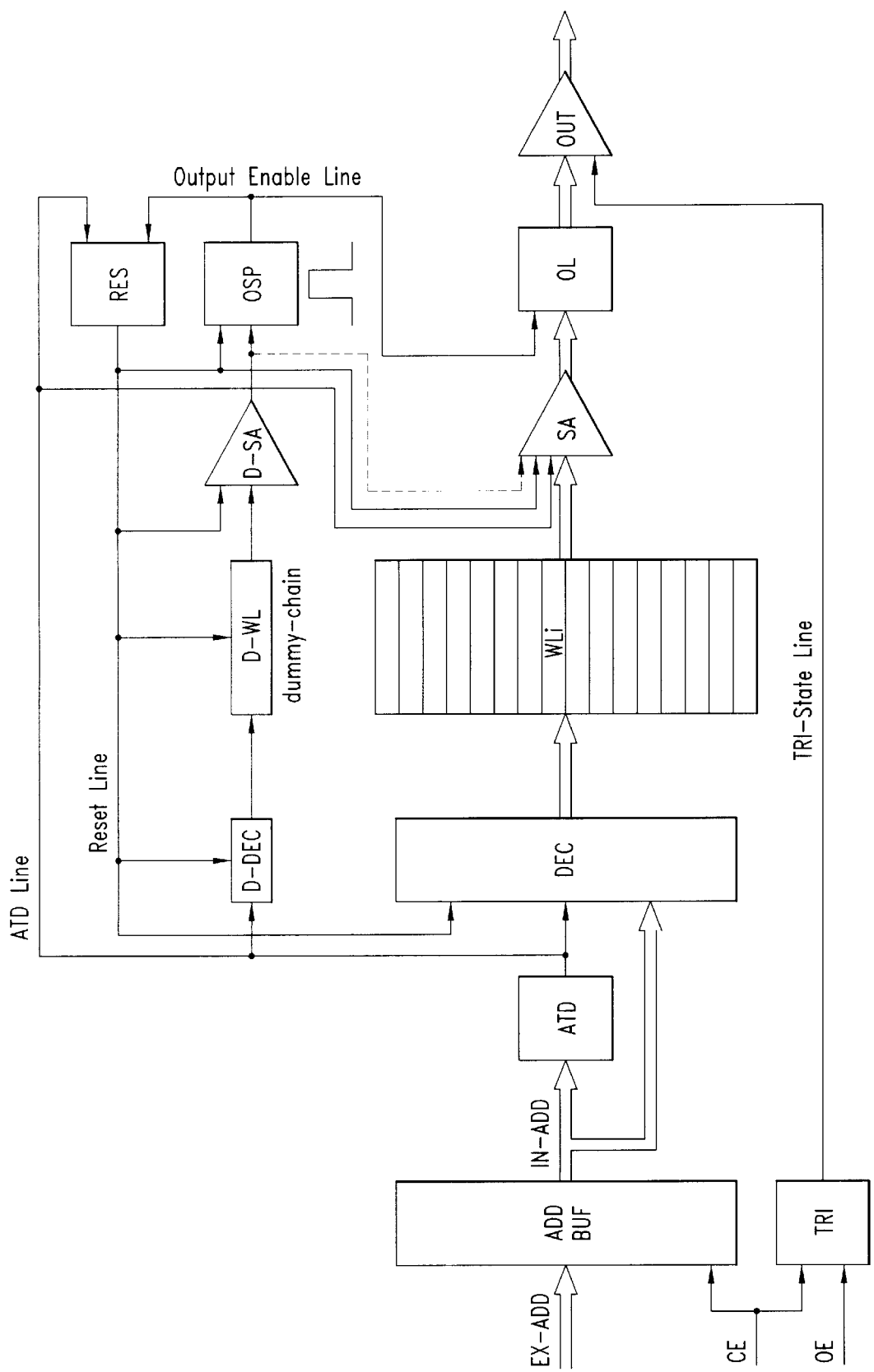
FIG. 3 is a functional block diagram of another embodiment of the invention, implementing also an auto-stand-by function of the circuit.

In accordance with the particularly preferred embodiment of the invention depicted in FIG. 3, the reset network of the anti-noise architecture of the invention is further exploited for implementing an automatic stand-by state of the memory upon the completion of a read cycle. As may be easily observed by comparing the block diagram of FIG. 3 with that of FIG. 1, the action of the set-reset network (ATD and Reset lines) is extended to the decoder (DEC) and sense amplifier (SA) blocks (and eventually to other power dissipating circuits of the memory such as voltage reference systems, etc.). Naturally, these circuital blocks of the basic memory circuit will be activated by any occurring ATD pulse. In this way, while an extracted (read) datum is transferred to an output buffer, the reset line which has meanwhile become active, resets beside the dummy wordline chain also the selected matrix's wordline, thus interrupting any static power consumption, and in practice all the power dissipating structures of the memory may be disabled. Therefore, at the end of any read cycle, neither wordline remains active nor any of the potentially dissipating structures of the memory such as the decoding and address circuitry (DEC) and the sensing circuitry (SA) remain enabled. What is achieved is a system that automatically puts itself in a stand-by condition upon completion of any read cycle.

Therefore, a new read cycle begins from a configuration with all the wordlines of the memory to ground potential, i.e., deselected. Therefore, when a new read cycle starts (i.e. during the initial transient), one and only one location of the memory is addressed. Advantageously the sensing circuits may be immediately enabled without waiting for a complete deselection of the old address, as is customarily done in known memories. The access time of the memory may thus be reduced without risking false readings because of an eventual "OR" condition of the system which is typical of any "multi-selection" method of operation, as adopted in commercially available memories, is excluded. In other words, in a known memory, if a preceding selection had pointed to a cell in an "ON" condition, this selection would coexist with a new selection for the entire transient and, if the new location was represented by a cell in an "OFF" condition, the first address would "impose" itself on the new address and the sense amplifier would not be capable of assuming a correct state until the "deselection process" of the "ON" cell had terminated. This delay in the attainment of a proper univocity of address negatively affects the access time of a memory, by delaying the moment when the sensing may be carried out reliably.

Alternatively, the dummy chain could be replaced with fewer elements than are in the real memory chain itself, in a different embodiment. For example, the dummy chain may include delay circuits, latches or counters that simulate the propagation through the memory without being replicates or dummy elements of the same configuration.

We claim:

1. A method for preventing spurious memory readings from a memory device caused by noise induced by transitions in an output buffer driven by a circuit capable of storing data extracted from a memory matrix of the memory device, said data storing circuit being in a disabled state during a propagation delay, in the memory device the method comprising the steps of:

upon a transition of memory address signals, replicating through a dummy chain the propagation delay of the transition of memory address signals through the memory device in producing new data; and enabling said data storing circuit to store the new data by means of an enabling pulse which is generated only after the replicated propagation delay.

2. The method according to claim 1 wherein the step of replicating includes the steps of:

receiving the transition of memory address signals;

generating a start signal responsive to the transition of memory address signals; and responsive to the start signal, using the dummy chain to replicate the propagation delay.

3. The method according to claim 1, after the step of enabling said data storing circuit, further comprising the step of:

disabling said data storing circuit to prevent the new data stored therein from being affected by noise.

4. The method according to claim 1, prior to the step of enabling, further comprising the step of:

enabling a sense amplifier connected to said data storing circuit to output the new data for storage by said data storing circuit.

5. A method of preventing erroneous memory readings from a memory device caused by noise induced by transitions in an output buffer driven by an output storage circuit, said storage circuit being in a disabled state during a propagation delay, in the memory device, the method comprising the steps of:

enabling the output storage circuit to receive new data from the memory device by generating an enable pulse a selected time period after a transition of memory address signals, the selected time period being at least equal to the propagation delay of the transition of memory address signals a dummy circuit chain in through the memory device in producing the new data.

6. The method according to claim 5 wherein the step of enabling the output storage circuit to receive new data includes the steps of:

using the dummy circuit chain to replicate the propagation delay of the transition of memory address signals through the memory device; and after the replicated propagation delay, generating the enable pulse.

7. The method according to claim 5 wherein the step of enabling the output storage circuit to receive new data includes the steps of:

receiving the transition of memory address signals;

generating a detection signal responsive to the transition of memory address signals; and responsive to the detection signal, using the dummy circuit chain to replicate the time of propagation of signals through the memory device.

8. The method according to claim 5, after the step of enabling the output storage circuit to receive new data, further comprising the step of:

disabling the output storage circuit to prevent the new data stored therein from being affected by noise.

9. The method according to claim 5, further comprising the step of:

after the transition of memory address signals, enabling a sense amplifier connected to the output storage circuit to output the new data for storage by the output storage circuit.

10. The method according to claim 5 wherein the new data is either a logic high value or a logic low value.

* * * * *